(12) United States Patent
Morinaga

(10) Patent No.: US 8,338,290 B2
(45) Date of Patent: *Dec. 25, 2012

(54) METHOD FOR FABRICATING SEMICONDUCTOR DEVICE

(75) Inventor: Yasunori Morinaga, Toyama (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/163,189

(22) Filed: Jun. 17, 2011

(65) Prior Publication Data

US 2011/0250750 A1    Oct. 13, 2011

Related U.S. Application Data

(63) Continuation of application No. PCT/JP2009/005678, filed on Oct. 28, 2009.

(30) Foreign Application Priority Data

Jan. 15, 2009    (JP) ................. 2009-006834

(51) Int. Cl.
    *H01L 21/00*    (2006.01)
    *H01L 21/44*    (2006.01)
(52) U.S. Cl. ............... 438/637; 438/639; 438/653
(58) Field of Classification Search ............ None
    See application file for complete search history.

(56) References Cited

U.S. PATENT DOCUMENTS

| 6,407,453 | B1 | 6/2002 | Watanabe et al. | |
| 6,879,046 | B2 * | 4/2005 | Gibson et al. | 257/760 |
| 8,017,518 | B2 * | 9/2011 | Morinaga et al. | 438/637 |
| 2003/0173671 | A1 | 9/2003 | Hironaga et al. | |
| 2008/0166870 | A1 * | 7/2008 | Huang et al. | 438/619 |
| 2009/0072224 | A1 * | 3/2009 | Aramaki et al. | 257/40 |
| 2009/0311859 | A1 * | 12/2009 | Bonilla et al. | 438/637 |
| 2010/0285667 | A1 * | 11/2010 | Bonilla et al. | 438/702 |
| 2011/0003402 | A1 * | 1/2011 | Chakrapani et al. | 438/4 |
| 2012/0018891 | A1 * | 1/2012 | Lin | 257/773 |

FOREIGN PATENT DOCUMENTS

| JP | 11-307474 | 11/1999 |
| JP | 2000-260770 | 9/2000 |
| JP | 2004-096052 | 3/2004 |
| JP | 2004-296668 | 10/2004 |
| JP | 2005-340288 | 12/2005 |
| JP | 2006-319365 | 11/2006 |
| JP | A 2007-339766 | * 7/2007 |

* cited by examiner

*Primary Examiner* — Seahvosh J. Nikmanesh

*Assistant Examiner* — Evren Seven

(74) *Attorney, Agent, or Firm* — McDermott Will & Emery LLP

(57) ABSTRACT

A method for fabricating a semiconductor device includes: (a) forming an interlayer insulating film on a substrate; (b) forming an interconnect in the interlayer insulating film; (c) applying an organic solution to an upper surface of the interconnect and an upper surface of the interlayer insulating film; (d) after (c), applying a silylating solution to the upper surface of the interconnect and the upper surface of the interlayer insulating film; (e) after (d), heating the substrate; and (f) forming a first liner insulating film at least on the upper surface of the interconnect.

15 Claims, 7 Drawing Sheets

(a)

(b)

(c)

(a)

(b)

(a)

(b)

(a)

(b)

METHOD FOR FABRICATING SEMICONDUCTOR DEVICE

CROSS-REFERENCE TO RELATED APPLICATION

This is a continuation of PCT International Application PCT/JP2009/005678 filed on Oct. 28, 2009, which claims priority to Japanese Patent Application No. 2009-006834 filed on Jan. 15, 2009. The disclosures of these applications including the specifications, the drawings, and the claims are hereby incorporated by reference in their entirety.

BACKGROUND

The technology disclosed in this specification relates to methods for fabricating a semiconductor device including an interconnect made of, for example, copper (Cu), and a diffusion barrier film provided on the interconnect to prevent the diffusion of metal.

As large scale semiconductor integrated circuits (LSI) are miniaturized, it is required to further increase the speed, reduce the power consumption, and ensure high reliability of semiconductor elements. For this reason, a method in which Cu, which has resistance lower than aluminum (Al), is used as an interconnect material to reduce interconnect resistance, a method in which a low dielectric constant insulating film generally referred to as a Low-k film is used as an insulating film between interconnects (hereinafter referred to as an interlayer insulating film) to reduce the capacitance between the interconnects and interlayer capacitance, or a method in which a diffusion barrier film is provided to prevent the diffusion of Cu to ensure high reliability is being considered.

To form a Cu interconnect, a method referred to as a damascene method is generally used. In this method, a recessed section is first formed in an interlayer insulating film made of a Low-k material formed on a substrate, and then a barrier metal film is formed on an inner surface of the recessed section, and on an upper surface of the interlayer insulating film. Next, the recessed section is filled with copper plating, and then excess copper and part of the barrier metal film which is on the upper surface of the interlayer insulating film are removed by chemical-mechanical polishing (CMP), thereby forming the Cu interconnect embedded in the recessed section. Next, a diffusion barrier film is formed on the interlayer insulating film, and on the Cu interconnect.

Japanese Patent Publication H11-307474 discloses the technique of using a SiN film as the above-described diffusion barrier film to reduce the diffusion of Cu into an interlayer insulating film made of a Low-k material.

SUMMARY

However, in the process of forming the diffusion barrier film made of SiN in the above-described fabrication method, the growth of SiN starts on an upper surface of a Cu interconnect, where grain boundaries serve as cores. If the diffusion barrier film is not formed to have a thickness of equal to or larger than ½ of the grain size of Cu, pinholes are formed in the diffusion barrier film. As a result, the performance the diffusion barrier film as a barrier against the diffusion of Cu is degraded, which may reduce the reliability of elements. To form miniaturized interconnects, interlayer capacitance has to be reduced, and the thickness of a diffusion barrier film is preferably reduced. However, when the thickness of the diffusion barrier film is reduced, pinholes are formed in the diffusion barrier film as described above. Thus, it is difficult to miniaturize interconnects with high reliability of semiconductor elements being ensured.

In view of the foregoing, it is an objective of the present disclosure to provide a method for fabricating a semiconductor device having miniaturized metal interconnects with the diffusion of an interconnect material being reduced.

An example method for fabricating a semiconductor device of the present invention includes: (a) forming an interlayer insulating film on a substrate; (b) forming an interconnect in the interlayer insulating film; (c) feeding an organic solution to an upper surface of the interconnect and an upper surface of the interlayer insulating film; (d) after (c), feeding a silylating solution to the upper surface of the interconnect and the upper surface of the interlayer insulating film; (e) after (d), heating the substrate; and (f) forming a first liner insulating film at least on the upper surface of the interconnect.

With this method, the organic solution is fed to the upper surface of the interconnect, and then the silylating solution is fed to the upper surface of the interconnect. Thus, the silylating solution is easily distributed across the upper surface of the interconnect, so that atoms of an interconnect material of the upper surface of the interconnect can uniformly be terminated with Si—CHx—NHy groups after heating. Therefore, the growth of the first liner insulating film made of, for example, SiCN is allowed with no pinhole being formed in the first liner insulating film. Thus, even when the first liner insulating film is formed to have a thickness smaller than that formed in the conventional method, the diffusion, etc. of the interconnect material into upper layers can be reduced, and thus high reliability of the semiconductor device can be obtained with an interconnect structure being miniaturized.

It is preferable to successively perform (c) and (d) so that the silylating solution can thoroughly be distributed across the upper surface of the interconnect. Moreover, it is preferable to successively perform (d) and (e) so that the interconnect material located on the upper surface of the interconnect can be uniformly and effectively silylated.

The method may further include: (g) after (a) and before (b), forming a hole in the interlayer insulating film; and (h) after (g) and before (b), forming a trench in the interlayer insulating film such that part of the trench overlaps the hole when viewed from above. Note that the "hole" referred to herein includes a contact hole in which a contact is formed to connect an interconnect in a first layer to a semiconductor element such as a transistor, and a via hole in which a via is formed to connect interconnects in second and further layers to a lower-layer interconnect.

In (b), a plug embedded in the hole and the interconnect which is embedded in the trench, and is connected to the plug can be substantially simultaneously formed. This so-called dual damascene process is preferable because the number of processes can be reduced compared to forming the plug and the interconnect in individual processes.

The interlayer insulating film may include a first interlayer insulating film in which the hole is formed, and a second interlayer insulating film which is formed on the first interlayer insulating film and in which the trench is formed, an upper surface of the second interlayer insulating film may be flush with the upper surface of the interlayer insulating film, and the method further may include: (i) after (g) and before (h), forming a plug embedded in the hole; (j) after (i) and before (h), feeding an organic solution to an upper surface of the plug and an upper surface of the first interlayer insulating film; (k) after (j) and before (h), feeding a silylating solution to the upper surface of the plug and the upper surface of the first interlayer insulating film; (l) after (k) and before (h), heating the substrate; and (m) before (h), forming a second liner insulating film at least on the upper surface of the plug.

The organic solution may be the same material as a solvent of the silylating solution.

The organic solution is preferably a solvent having no reactivity with a silylating agent contained in the silylating solution.

The organic solution preferably contains at least one selected from the group consisting of hydrocarbons, alcohols, ketones, esters, and ethers.

The organic solution preferably contains at least one selected from the group consisting of methanol, ethanol, propanol, acetone, methyl ethyl ketone, diethyl ketone, and phenol.

The silylating agent contained in the silylating solution preferably includes an alkyl group having a silazane bond.

The first liner insulating film preferably includes a SiCN film, so that the diffusion of the interconnect material can effectively be reduced.

In (e), heating temperature may be stepwise increased in heating the substrate.

In (e), treatment temperature of the substrate is preferably higher than or equal to 150° C. and lower than or equal to 450° C.

The interconnect may contain copper as a main component.

According to the example method for fabricating the semiconductor device of the present invention, the growth of diffusion barrier film (liner insulating film) preventing diffusion of the interconnect material such as Cu is allowed with no pinhole being formed in the diffusion barrier film. Therefore, the diffusion of the interconnect material into upper layers can efficiently be reduced with the thickness of the liner insulating film being reduced.

DETAILED DESCRIPTION

Embodiments the present invention will be described below with reference to the drawings.

(First Embodiment)
-Method For Fabricating Semiconductor Device-

FIGS. 1A-1E, and FIGS. 2A-2D are cross-sectional views illustrating a method for fabricating a semiconductor device of a first embodiment. Here, a dual damascene method in which a plug and a metal interconnect are formed in a same process is described. Note that materials included in layers, the thickness of films, methods of depositing the films, etc. described below are examples that do not limit the scope of the invention.

Figure 1:
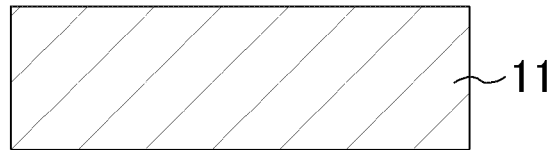
FIGS. 1A-1E are cross-sectional views illustrating a method for fabricating a semiconductor device of a first embodiment.
Figure 1:
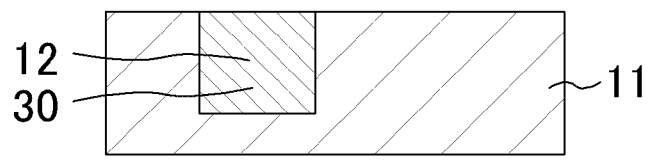
Figure 1:
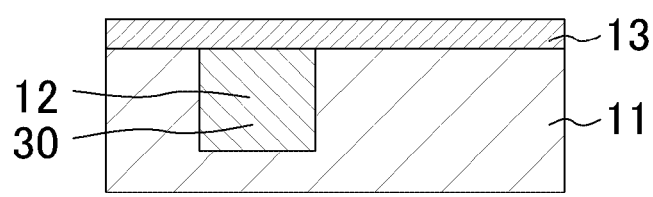
Figure 1:
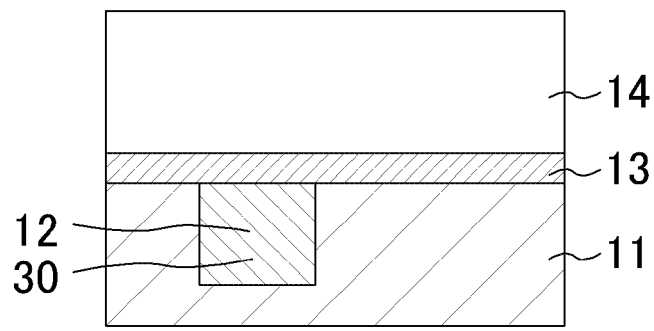
Figure 1:
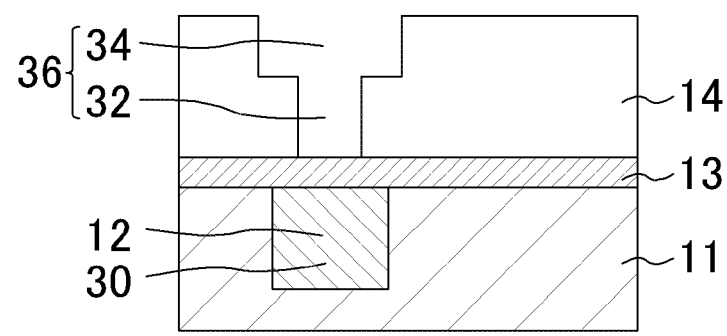

First, in the process illustrated in FIG. 1A, a substrate 11 provided with a required semiconductor element (not shown) is prepared. Note that the substrate 11 illustrated in FIG. 1A includes a semiconductor substrate made of, for example, silicon, and a first interlayer insulating film which is formed on the semiconductor substrate, and in which the semiconductor element is embedded. The first interlayer insulating film is made of, for example, non-silicate glass (NSG).

Next, in the process illustrated in FIG. 1B, a first recessed section 30 is formed in the first interlayer insulating film by lithography, etching, and the like. Then, an underlying metal interconnect 12 including a barrier metal film and a Cu film is formed by a known method so that the underlying metal interconnect 12 is embedded in the first recessed section 30. Note that a metal film obtained by adding metal such as Al to Cu may be provided instead of the Cu film of the underlying metal interconnect.

Next, in the fabrication process of the present embodiment, an organic solution is applied to upper surfaces of the substrate 11 and the underlying metal interconnect 12, and then a silylating solution is applied. Subsequently, before the upper surface of the substrate 11 which is wet with the organic solvent dries, the substrate 11 is heated. The above-described pretreatment before forming a diffusion barrier film to prevent the diffusion of Cu will be described in detail later.

Next, in the process illustrated in FIG. 1C, a first liner insulating film (first diffusion barrier film) 13 made of, for example, SiC (or SiCO or SiCN) is formed by, for example, chemical vapor deposition (CVD) to have a thickness of about 60 nm. The first liner insulating film 13 serves as an etching stopper when a via hole (hole) is formed in a later process, and prevents the diffusion of Cu from the underlying metal interconnect 12 into a second interlayer insulating film 14. Next, the second interlayer insulating film 14 is formed on the first liner insulating film 13 by, for example, spin coating. As the second interlayer insulating film 14, a low dielectric constant film (Low-k film) is used, and the thickness of the Low-k film is, for example, 300 nm.

The k-value of the Low-k film is preferably about 2.7 or less. With such a k-value, the Low-k film is generally a porous membrane having holes. In this process, a liquid Low-k film material is applied to the substrate (the semiconductor device in the process of fabrication), and then a solvent is, for example, evaporated, thereby forming the second interlayer insulating film 14. Note that the method for forming the second interlayer insulating film 14 is not limited to spin coating, and the second interlayer insulating film 14 may be formed by a method such as CVD capable of forming a porous membrane. Using a Low-k film as the second interlayer insulating film 14 can limit the increase in capacitance between interconnects and interlayer capacitance even when the interconnects are miniaturized. Moreover, when the second interlayer insulating film 14 is made of a Low-k film, it is preferable to perform the property modification process (cure process) of irradiating the second interlayer insulating film 14 with a UV beam or an electron beam to enhance the mechanical strength.

Next, in the process illustrated in FIG. 1E, for example, a resist is applied to an upper surface of the second interlayer insulating film 14, and then is subjected to lithography, thereby forming a via pattern. Using the via pattern, the second interlayer insulating film 14 is etched, thereby forming a via hole 32. Subsequently, the resist for forming the via pattern is removed, and then a resist is embedded in the via hole 32, and is formed on the upper surface of the second interlayer insulating film 14, and then lithography is performed to form a trench pattern. Using the trench pattern, etching is performed. Then, the resist is removed by, for example, ashing, and the substrate is cleaned to form a trench 34 in which an interconnect is to be formed. Note that when etching is performed to form the via hole 32 and the trench 34, a hard mask provided on the resist may be used. Moreover, in the present process, the via hole 32 may be formed after forming the trench 34. In the following description, the via hole 32 and the trench 34 are together referred to as "second recessed section 36."

Figure 2:
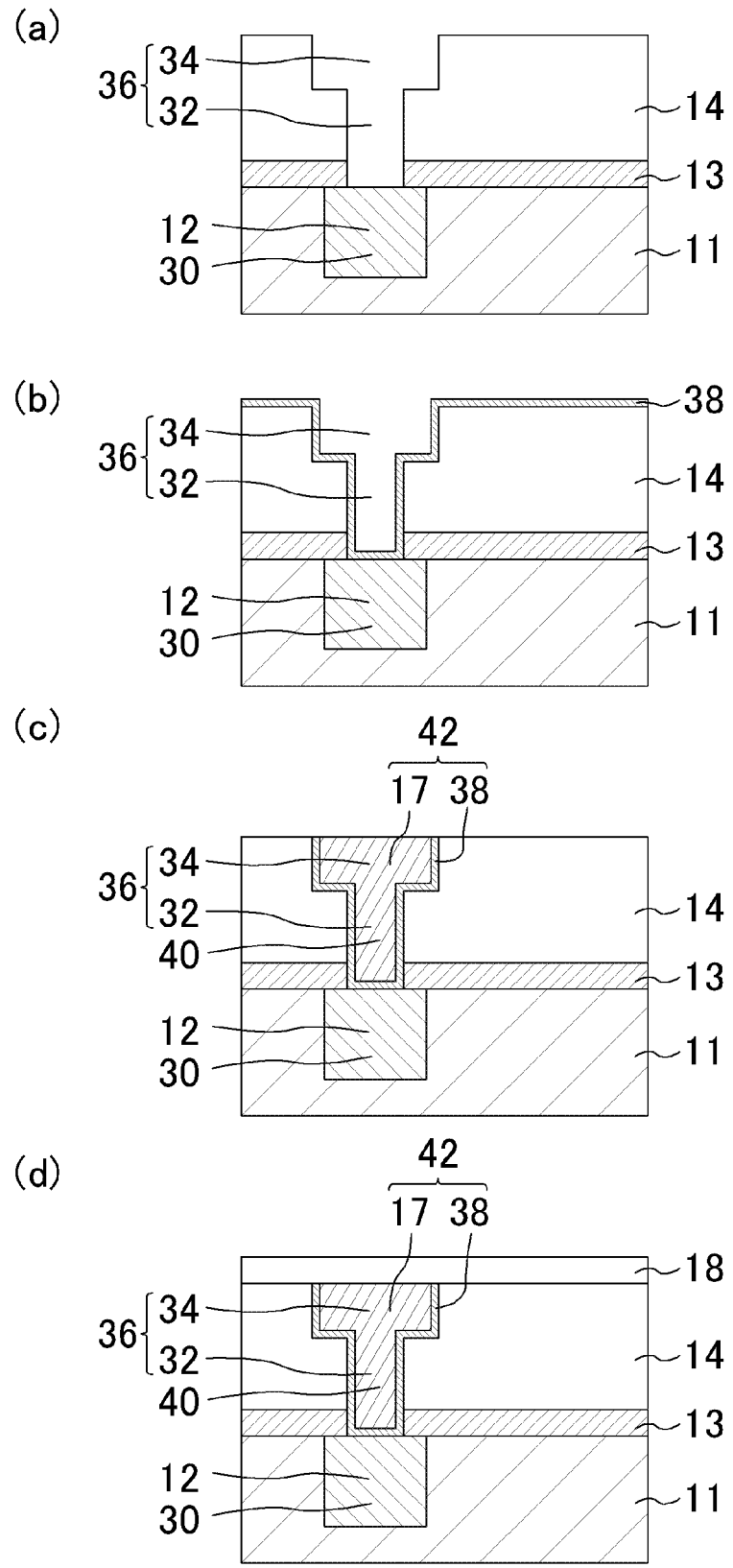
FIGS. 2A-2D are cross-sectional views illustrating the method for fabricating the semiconductor device of the first embodiment.

Next, in the process illustrated in FIG. 2A, part of the first liner insulating film 13 which is located at the bottom of the via hole 32 is selectively removed by lithography and etching, thereby exposing the underlying metal interconnect 12. After that, a resist used for etching is removed by, for example, ashing, and the substrate is cleaned.

Next, in the process illustrated in FIG. 2B, a barrier metal film 38 is formed on the upper surface of the second interlayer insulating film 14 and an inner surface of the second recessed section 36. In the present process, for example, as the barrier metal film 38, a Ta/TaN film is deposited to have a thickness of about 26 nm by, for example, atomic laser deposition (ALD).

Next, in the process illustrated in FIG. 2C, a plug 40 and a Cu interconnect 42 which are integrally formed, and fill the second recessed section 36 are formed. Specifically, a Cu seed film (not shown) is first formed on the entirety of the barrier metal film 38 by, for example, sputtering. The Cu seed film has a thickness of, for example, 600 nm. Subsequently, a Cu film 17 is formed on the Cu seed film by plating such that at least the via hole 32 and the trench 34 are filled with the Cu film 17, and then the properties of the Cu film 17, and the like are modified by thermal annealing at 400° C. for 30 minutes in a furnace. Next, unnecessary parts of the Cu film 17 (and the Cu seed film), and the barrier metal film 38 which are provided outside the trench 34 are removed by, for example, CMP, and an upper surface of the Cu film 17 is planarized. Parts of the barrier metal film 38, the Cu seed film, and the Cu film 17 which are formed in the via hole 32 serve as the plug 40, and parts of the barrier metal film 38, the Cu seed film, and the Cu film 17 which are formed in the trench 34 serve as the Cu interconnect (metal interconnect) 42. Note that other metal may be added to the Cu film 17. Moreover, metal used as a main material of the metal interconnect may be metal such as Au, Ag, Pt, etc. having a resistance equal to or less than Cu.

Next, in the same manner as that before forming the first liner insulating film 13, an organic solution is applied to the upper surface of the second interlayer insulating film 14 and an upper surface of the Cu interconnect 42, and then a silylating solution is applied. Subsequently, before the upper surface of the substrate 11 which is wet with the organic solvent dries, the substrate 11 is heated.

After that, in the process illustrated in FIG. 2D, a second diffusion barrier film (second liner insulating film) 18 is formed on the second interlayer insulating film 14 and the Cu interconnect 42. Thus, the metal interconnect containing copper as a main component can be formed.

Figure 3:
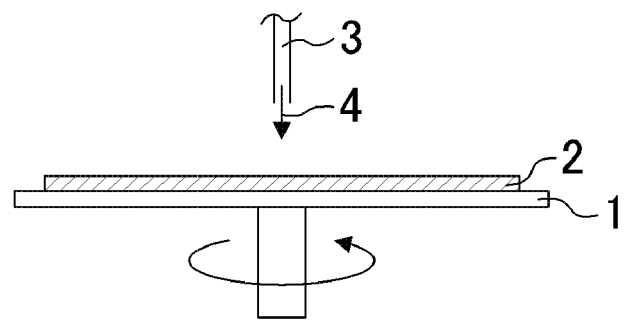
FIGS. 3A-3C are cross-sectional views illustrating pretreatment steps to form a diffusion barrier film in the method for fabricating the semiconductor device of the first embodiment.
Figure 3:
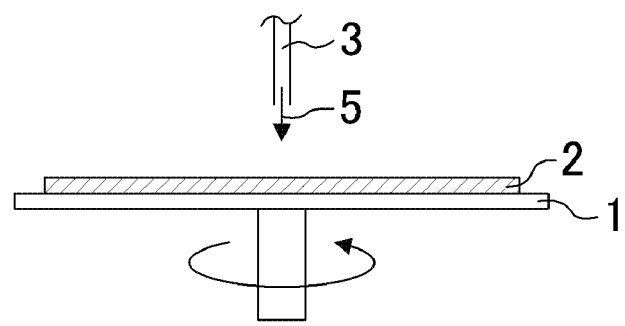
Figure 3:
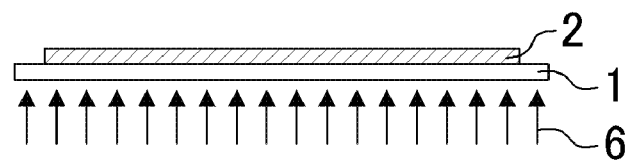

In the method for fabricating the semiconductor device of the present embodiment, application of the organic solution, application of the silylating solution, and heating of the substrate are successively performed, as the pretreatment to form the diffusion barrier films which prevent the diffusion of metal, in the processes illustrated in FIGS. 1B, 2C. FIGS. 3A-3C are cross-sectional views illustrating pretreatment steps to form the diffusion barrier films in the method for fabricating the semiconductor device of the present embodiment.

As illustrated in FIG. 3A, after the metal interconnect embedded in the interlayer insulating film is formed, a substrate 2 (a semiconductor device including the substrate 11 in the process of fabrication) is placed on an upper surface of a spindle 1 having a vacuum chuck function, and in this state, an organic solution 4 is fed from a nozzle 3 to an upper surface of the substrate 2. After the organic solution 4 is fed, the spindle 1 is rotated, for example, at about 1000 rpm (min$^{-1}$), and excess portion of the organic solution 4 is spun off the spindle 1, and then the rotation is stopped.

Next, as illustrated in FIG. 3B, before the fed organic solution 4 dries, a silylating solution 5 is fed to the upper surface of the substrate 2 in the same manner as that to apply the organic solution, and the spindle 1 is rotated. Thus, this step is preferably performed successively to the step illustrated in FIG. 3A.

Thereafter, as illustrated in FIG. 3C, the substrate 2 is subjected to heat treatment 6, for example, at 120° C., 230° C., and 400° C. each for one minute, thereby silylating the metal interconnect. As described above, thermal temperature may stepwise be increased, or may continuously be increased. The stepwise increasing of the thermal temperature provides the advantage that removal of moisture, removal of solvent, final reaction, etc. can be performed at a more suitable temperature.

This procedure silylates the upper surface of the underlying metal interconnect 12 in the process illustrated in FIG. 1B, and the upper surface of the Cu interconnect 42 in the process illustrated in FIG. 2C. Note that substrate temperature is preferably 150° C. or higher, and is more preferably 180° C., but the upper limit of the substrate temperature is preferably 450° C. or lower so that a thermal budget in manufacturing does not exceed an allowable range. This step is preferably performed successively to the step illustrated in FIG. 3B.

-Advantages of Method For Fabricating Semiconductor Device of the Present Embodiment- Next, advantages of the above-described treatment in the fabrication method of the present embodiment will be described in comparison to a conventional fabrication method. FIG. 4A is a cross-sectional view illustrating a configuration of a Cu interconnect of a semiconductor device after a second diffusion barrier film is deposited by a method of a comparative example, and FIG. 4B is an enlarged view illustrating an interface section between the Cu interconnect and the second diffusion barrier film of FIG. 4A. FIGS. 5A is a cross-sectional view illustrating a configuration of the Cu interconnect of the semiconductor device after the second diffusion barrier film is deposited by the method of the present embodiment, and FIG. 5B is an enlarged view illustrating an interface section between the Cu interconnect and the second diffusion barrier film of FIG. 5A. Note that the semiconductor device of the comparative example of FIGS.

4A, 4B is fabricated by the same processes as those to fabricate the semiconductor device of the present invention except that the treatment illustrated in FIGS. 3A-3C is not performed in the comparative example.

Figure 4:
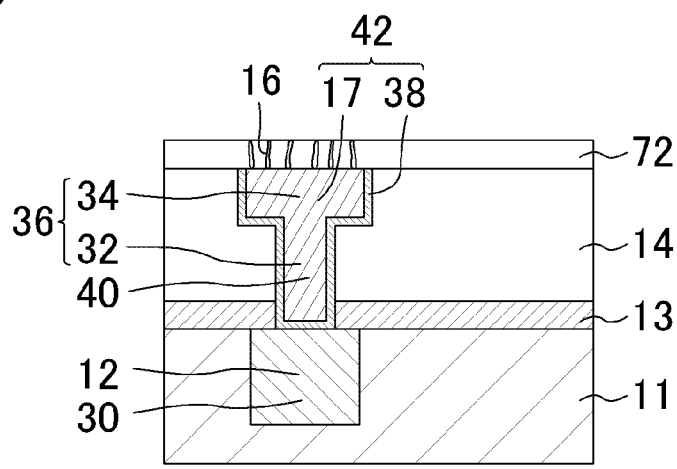
FIG. 4A is a cross-sectional view illustrating a configuration of a Cu interconnect of a semiconductor device after a second diffusion barrier film is deposited in a method of a comparative example.
FIG. 4B is an enlarged view illustrating an interface section between the Cu interconnect and the second diffusion barrier film of FIG. 4A.
Figure 4:
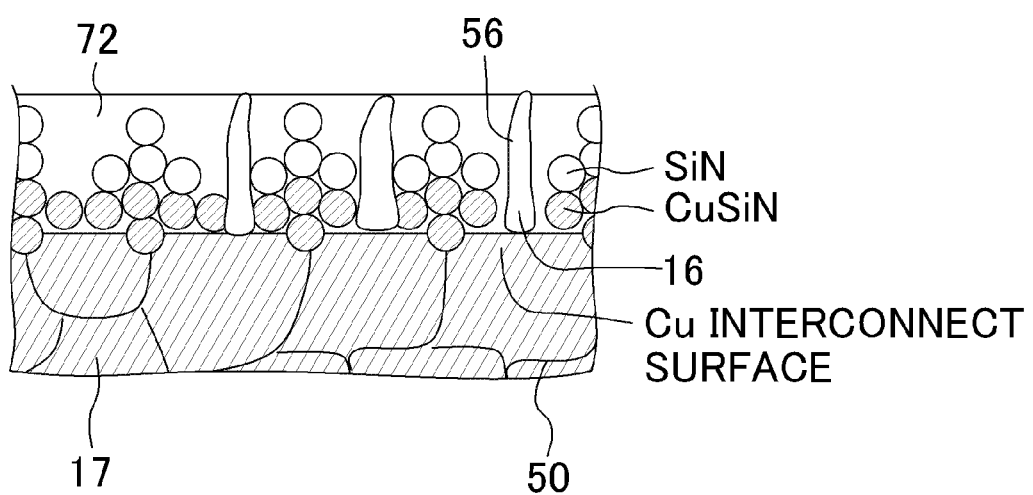
Figure 5:
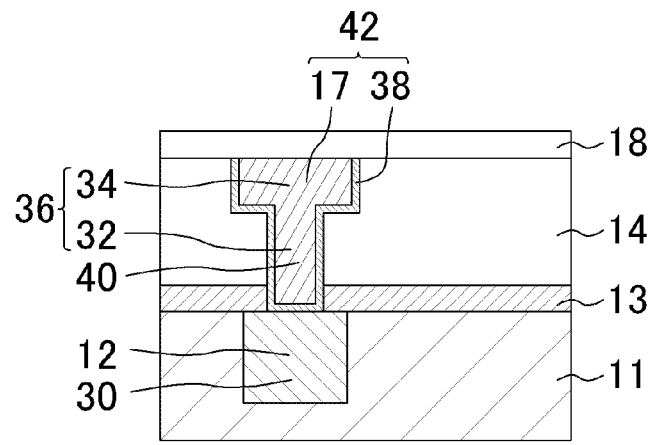
FIG. 5A is a cross-sectional view illustrating a configuration of a Cu interconnect of the semiconductor device after a second diffusion barrier film is deposited in the method of the first embodiment.
FIG. 5B is an enlarged view illustrating an interface section between the Cu interconnect and the second diffusion barrier film of FIG. 5A.
Figure 5:
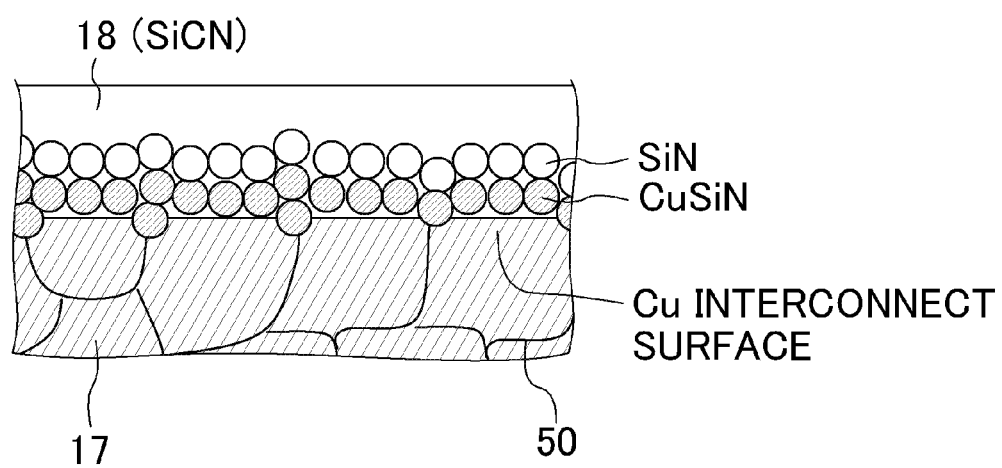

As illustrated in FIG. 4, when a second diffusion barrier film 72 made of, for example, SiCN is formed by, for example, CVD without performing any particular treatment after forming a Cu interconnect 42, the growth of the second diffusion barrier film 72 starts, in an early stage of formation of the second diffusion barrier film 72, such that SiN is embedded in grain boundaries 50 of an upper surface of the Cu interconnect 42. That is, SiN contained in the second diffusion barrier film 72 is site-selectively deposited, in the early stage, on the upper surface of the Cu interconnect 42. Thus, the growth of SiN is not uniform on the upper surface of the Cu interconnect 42, which results in low adhesiveness between the Cu interconnect 42 and the second diffusion barrier film 72, and formation of pinholes 16 in the second diffusion barrier film 72. When the adhesiveness between the Cu interconnect 42 and the second diffusion barrier film 72 is low, or the pinholes 16 are formed in the second diffusion barrier film 72, the reliability of the interconnect is reduced.

When the thickness of the second diffusion barrier film 72 is increased, the influence of the pinholes 16 can be reduced, but the second diffusion barrier film 72 has to have a thickness of about ½ of the grain size of Cu contained in the Cu interconnect 42 (Cu film 17) so that the performance the second diffusion barrier film 72 as a barrier against the diffusion of Cu is less susceptible to degradation. For example, when the Cu interconnect 42 has a width of 60 nm, Cu has a maximum grain size of about 60 nm, and thus the second diffusion barrier film 72 has to have a thickness of at least 30 nm or greater. On the other hand, in order to limit interlayer capacitance or the capacitance between plugs, the second diffusion barrier film 72 has to have a thickness of about 60 nm or less. For this reason, the allowable range of the thickness of the second diffusion barrier film 72 in the method of the comparative example is very narrow when manufacturing tolerances are included. If the Cu interconnect will further be miniaturized, the degree of design freedom of the second diffusion barrier film 72 will further be reduced.

Figure 6:
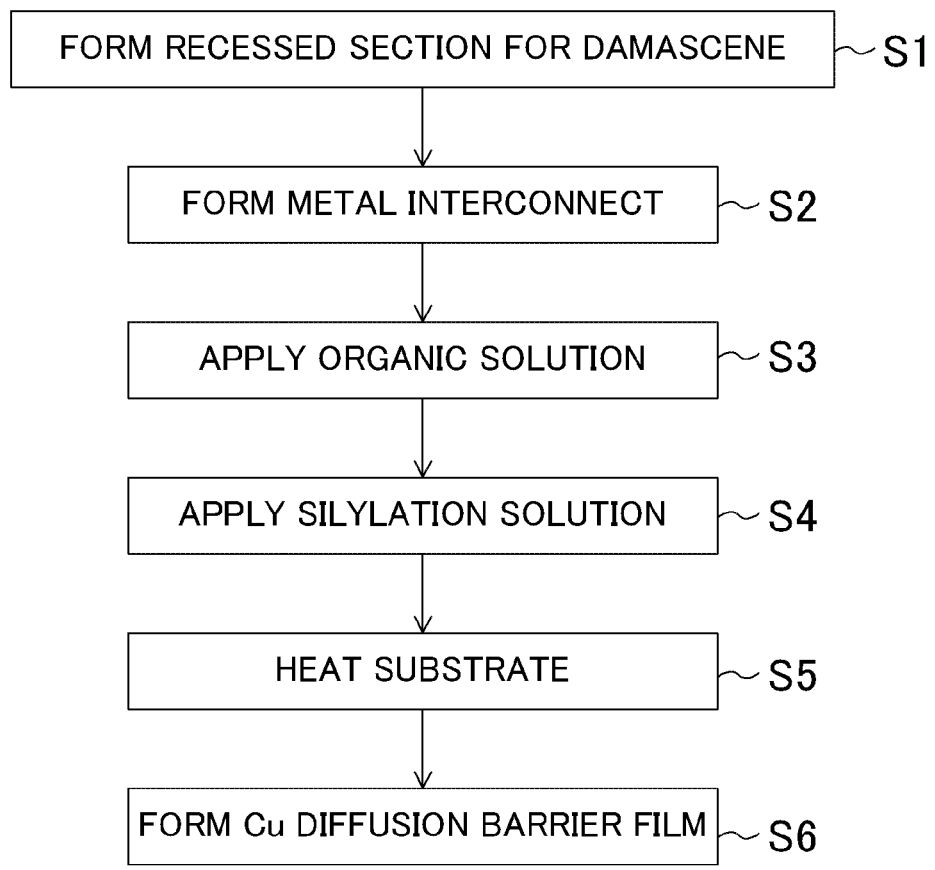
FIG. 6 is a flow chart illustrating steps from the formation of a recessed section to the formation of a diffusion barrier film in the method for fabricating the semiconductor device of the first embodiment.

In contrast, in the fabrication method of the present embodiment, as illustrated in FIG. 6, after the Cu interconnect 42 is formed (steps S1, S2), a silylating solution including, for example, Si—CHx—NHy groups in its molecules is applied to the upper surface of the substrate 2 (step S4), and the substrate 2 is heated (step S5). After that, in step S6, the second diffusion barrier film 18 made of Cu is formed. In this way, as illustrated in FIG. 5B, Si—N bonds can uniformly be added to the entirety of the upper surface of the Cu film 17. Thus, for example, the growth of the second diffusion barrier film 18 made of, for example, SiCN is allowed with no pinhole being formed in the second diffusion barrier film 18. In this case, CuSiN molecules are uniformly disposed also on the upper surface of the Cu interconnect 42 except for the grain boundaries, and a SiCN layer is formed on the CuSiN molecules with SiN molecules interposed therebetween.

Moreover, in the method of the present embodiment, the organic solution 4 is fed to the upper surface of the substrate 2 (step S3), and the silylating solution is fed with the substrate 2 being wet with the organic solution 4. This improves the wetting property of the silylating solution on the substrate 2, so that silylation reaction of Cu atoms can proceed more efficiently. Therefore, even when the thickness of the second diffusion barrier film 18 is reduced to, for example, about 10 nm, the performance of the second diffusion barrier film 18 as a barrier against the diffusion of Cu can satisfactorily be exhibited. Thus, the degree of design freedom of the second diffusion barrier film 18 can significantly be improved, and the diffusion of Cu can be prevented without increasing interlayer capacitance, and the like even when the Cu interconnect is miniaturized, so that a semiconductor device with high reliability can be fabricated. Note that when the Cu interconnect 42 has a width of 60 nm, the upper limit of the thickness of the second diffusion barrier film 18 is preferably about 60 nm as described above, and thus the thickness range of the second diffusion barrier film 18 is preferably greater than or equal to 10 nm and less than or equal to 60 nm. A second diffusion barrier film 18 having a thickness of greater than or equal to 10 nm and less than or equal to 30 nm is more preferable since such a second diffusion barrier film 18 can address further miniaturization of the metal interconnect.

The silylating solution used in the fabrication method of the present embodiment is preferably a solution obtained by mixing Si which is contained in a silazane bond (Si—N), and is bonded to three alkyl groups (e.g., methyl groups) (e.g., HMDS or TMSDMA) with a 2-heptanone solvent. When silylation proceeds, other silylating solutions may be used.

The organic solution used in the method of the present embodiment is not particularly limited as long as it is the same as the solvent of the silylating solution, or has compatibility with the solvent of the silylating solution and no reactivity with a silylating agent in the silylating solution. Specifically, the organic solution may be at least one selected from the group consisting of hydrocarbons, alcohols, ketones, esters, and ethers. More specifically, an organic solvent can be at least one selected from the group consisting of toluene, xylene, p-xylene, m-xylene, mesitylene, solvent naphtha H, solvent naphtha A, pentane, hexane, isohexane, heptane, nonane, octane, dodecane, 2-methylbutane, hexadecane, tridecane, pentadecane, cyclopentane, 2,2,4-trimethylpentane, benzene, 1,2-dimethyl benzene, 1,2,4-trimethylbenzene, mineral spirit, kerosene, isobutylbenzene, methylnaphthalene, ethyltoluene, ligroin, acetone, 3-pentanone, diethyl ketone, methyl ethyl ketone, methanol, ethanol, 2-propanol, 3-propanol, acetone, ethylene oxide, benzene, toluene, cyclohexanone, butyrolactone, methyl ethyl ketone, diethyl ketone, anisole, octane, dimethyl ether, diethyl ether, and phenol. In particular, methanol, ethanol, propanol, acetone, methyl ethyl ketone, diethyl ketone, and phenol have a comparatively small molecular weight, and thus are suitable to the silylating agent. Therefore, at least one of these substances is preferably used as the organic solution. Note that liquid other than the solutions listed here may be used as the organic solution.

The advantages obtained by performing steps S3-S6 illustrated in FIG. 6 after forming the Cu interconnect 42 have been described here. However, also when the treatment of steps S3-S6 is performed after forming the underlying metal interconnect 12 containing Cu, the diffusion of Cu into the second interlayer insulating film 14 can be reduced while reducing the thickness of the first liner insulating film 13 (first diffusion barrier film) as in the case of performing the treatment after forming the Cu interconnect 42.

Note that the first liner insulating film 13 and the second diffusion barrier film 18 can be made of a material having a function that reduces the diffusion of an interconnect material such as Cu. For example, the first liner insulating film 13 and the second diffusion barrier film 18 each may be the SiN film, the SiCN film, or a layered film including a SiCN film and a SiCO film which are stacked in this order.

In the present embodiment, the method of applying the organic solution and the silylating solution to the upper surface of the substrate with a spindle has been described. However, other methods, for example, immersing the upper surface of the substrate in the organic solution and the silylating solution may be used to feed the organic solution and the silylating solution to the upper surface of the substrate.

A method in which the treatment of using an organic solution and a silylating solution, and heating a substrate is performed after forming metal interconnects in second and further layers and plugs directly under the metal interconnects has been described as an example. However, advantages similar to those described above are also obtained by performing the treatment after forming a Cu interconnect in a first layer and a contact to connect the Cu interconnect in the first layer to a semiconductor element.

(Second Embodiment)

Figure 7:
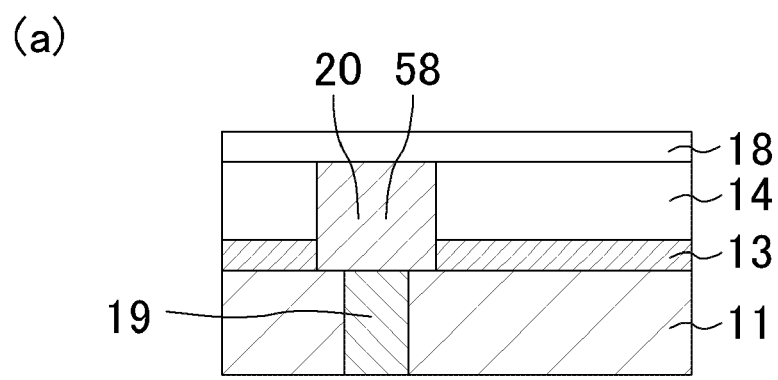
FIGS. 7A, 7B are cross-sectional views illustrating a method for fabricating a semiconductor device of a second embodiment of the present invention.
Figure 7:
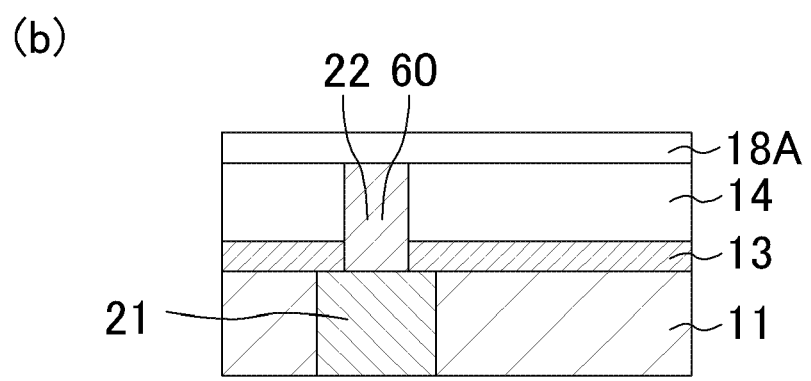

FIGS. 7A, 7B are cross-sectional views illustrating a method for fabricating a semiconductor device of a second embodiment of the present invention. The fabrication method of the present embodiment is a method in which the treatment illustrated in FIGS. 3A-3C, and FIG. 6 of the first embodiment is applied to a so-called single damascene process.

As illustrated in FIG. 7A, a plug 19 embedded in a first interlayer insulating film in an upper portion of a substrate 11 is formed, and then a first liner insulating film 13 is formed on the first interlayer insulating film and on the plug 19. Next, a second interlayer insulating film 14 made of a Low-k material is formed on the first liner insulating film 13, and then the second interlayer insulating film 14 and the first liner insulating film 13 are etched, thereby forming a trench 20 which reach an upper surface of the plug 19 and part of an upper surface of the first interlayer insulating film. Next, a barrier metal film is formed on an inner surface of the trench 20 and on an upper surface of the second interlayer insulating film 14, and then a seed film made of Cu is formed. On the seed film, a Cu film is formed by plating so that the Cu film has a thickness that fills at least the trench 20. Subsequently, the Cu film and the barrier metal film are polished by CMP until the upper surface of the second interlayer insulating film 14 is exposed, thereby forming a metal interconnect 58 connected to the plug 19.

Next, an organic solution is applied to an upper surface of the substrate (the semiconductor device in the process of fabrication) in a manner similar to that in the first embodiment, and subsequently, a silylating solution is applied. Next, the substrate is heated with the substrate being wet with the organic solution so that Cu atoms of an upper surface of the metal interconnect 58 are terminated with Si—CHx—NHy groups. Next, a second diffusion barrier film 18 is formed on the second interlayer insulating film 14 and the metal interconnect 58.

As described above, the second diffusion barrier film 18 including no pinhole can also be formed on the metal interconnect 58 formed by the single damascene process. Thus, even when the thickness of the second diffusion barrier film 18 is reduced, the diffusion of Cu can be prevented, which allows both reduction in interlayer capacitance and in capacitance between interconnects and prevention of the diffusion of the interconnect material. Moreover, the above-described treatment of using the organic solution and the silylating solution, and heating the substrate 11 may be performed after forming the plug 19 and before forming the first liner insulating film 13.

Alternatively, as illustrated in FIG. 7B, the treatment illustrated in step S3-S6 of FIG. 6 can be performed after a plug 60 is formed by the single damascene process.

That is, an underlying metal interconnect 21 embedded in a first interlayer insulating film (not shown) formed in an upper portion of a substrate 11 is formed, and then a first liner insulating film 13 and a second interlayer insulating film 14 made of a Low-k material are sequentially formed on the substrate 11 (first interlayer insulating film) and the underlying metal interconnect 21. Next, the second interlayer insulating film 14 and the first liner insulating film 13 are etched, thereby forming a via hole 22 which reaches an upper surface of the underlying metal interconnect 21. Then, the plug 60 including a barrier metal film and a Cu film is formed in the via hole 22. Thereafter, an organic solution is applied to an upper surface of the substrate (semiconductor device in the process of fabrication), and a silylating solution is subsequently applied. After that, the substrate is heated with the substrate being wet with the organic solution so that Cu atoms of an upper surface of the plug 60 are terminated with Si—CHx—NHy groups. Then, a second diffusion barrier film 18A is formed on the second interlayer insulating film 14 and the plug 60. Also in this case, the formation of pinholes in the second diffusion barrier film 18A can be reduced. Moreover, when silylation treatment is performed before forming the diffusion barrier film on the metal interconnect, and before forming the diffusion barrier film on the plug, degradation in reliability of the semiconductor device can more effectively be reduced. That is, the above method can reduce degradation in reliability of a semiconductor device having a single damascene structure in which recessed sections such as a trench and a via hole are formed in an upper portion of a substrate.

As described above, the example fabrication method of the present invention is preferably applicable to fabrication of semiconductor devices including embedded metal interconnects.

What is claimed is:

1. A method for fabricating a semiconductor device, the method comprising:
   (a) forming an interlayer insulating film on a substrate;
   (b) forming an interconnect in the interlayer insulating film;
   (c) feeding an organic solution to an upper surface of the interconnect and an upper surface of the interlayer insulating film;
   (d) after (c), feeding a silylating solution to the upper surface of the interconnect and the upper surface of the interlayer insulating film;
   (e) after (d), heating the substrate; and
   (f) forming a first liner insulating film at least on the upper surface of the interconnect.

2. The method of claim 1, wherein
   (c) and (d) are successively performed.

3. The method of claim 2, wherein
   (d) and (e) are successively performed.

4. The method of claim 1, further comprising:
   (g) after (a) and before (b), forming a hole in the interlayer insulating film; and
   (h) after (g) and before (b), forming a trench in the interlayer insulating film such that part of the trench overlaps the hole when viewed from above.

5. The method of claim 4, wherein
   in (b), a plug embedded in the hole and the interconnect which is embedded in the trench, and is connected to the plug are substantially simultaneously formed.

6. The method of claim 4, wherein
   the interlayer insulating film includes a first interlayer insulating film in which the hole is formed, and a second interlayer insulating film which is formed on the first interlayer insulating film and in which the trench is formed, an upper surface of the second interlayer insulating film is flush with the upper surface of the interlayer insulating film, and the method further includes:
- (i) after (g) and before (h), forming a plug embedded in the hole;
- (j) after (i) and before (h), feeding an organic solution to an upper surface of the plug and an upper surface of the first interlayer insulating film;
- (k) after (j) and before (h), feeding a silylating solution to the upper surface of the plug and the upper surface of the first interlayer insulating film;
- (l) after (k) and before (h), heating the substrate; and
- (m) before (h), forming a second liner insulating film at least on the upper surface of the plug.

7. The method of claim 1, wherein
the organic solution is the same material as a solvent of the silylating solution.

8. The method of claim 1, wherein
the organic solution is a solvent having no reactivity with a silylating agent contained in the silylating solution.

9. The method of claim 1, wherein
the organic solution contains at least one selected from the group consisting of hydrocarbons, alcohols, ketones, esters, and ethers.

10. The method of claim 1, wherein
the organic solution contains at least one selected from the group consisting of methanol, ethanol, propanol, acetone, methyl ethyl ketone, diethyl ketone, and phenol.

11. The method of claim 1, wherein
the silylating agent contained in the silylating solution includes an alkyl group having a silazane bond.

12. The method of claim 1, wherein
the first liner insulating film includes a SiCN film.

13. The method of claim 1, wherein
in (e), heating temperature is stepwise increased in heating the substrate.

14. The method of claim 13, wherein
in (e), treatment temperature of the substrate is higher than or equal to 150° C. and lower than or equal to 450° C.

15. The method of claim 1, wherein
the interconnect includes copper as a main component.

* * * * *